United States Patent
Wang et al.

(10) Patent No.: US 11,107,723 B1
(45) Date of Patent: Aug. 31, 2021

(54) METHOD OF FABRICATING SEMICONDUCTOR DEVICE

(71) Applicant: United Semiconductor (Xiamen) Co., Ltd., Fujian (CN)

(72) Inventors: Long Wang, Shamen (CN); Zijun Sun, Shamen (CN); Chin-Chun Huang, Hsinchu County (TW); Hailong Gu, Singapore (SG); Penghui Lu, Shamen (CN); Wen Yi Tan, Xiamen (CN)

(73) Assignee: United Semiconductor (Xiamen) Co., Ltd., Fujian (CN)

( * ) Notice: Subject to any disclaimer, the term of this patent is extended or adjusted under 35 U.S.C. 154(b) by 31 days.

(21) Appl. No.: 16/820,730

(22) Filed: Mar. 17, 2020

(30) Foreign Application Priority Data

Feb. 13, 2020 (CN) .......................... 202010089886.7

(51) Int. Cl.
*H01L 21/70* (2006.01)
*H01L 21/762* (2006.01)
*H01L 21/768* (2006.01)

(52) U.S. Cl.
CPC .. *H01L 21/76224* (2013.01); *H01L 21/76816* (2013.01)

(58) Field of Classification Search
CPC .................... H01L 21/76224; H01L 21/76816
See application file for complete search history.

(56) References Cited

U.S. PATENT DOCUMENTS

| 2008/0160768 | A1* | 7/2008 | Ni | H01L 21/0206 438/703 |
| 2009/0236681 | A1* | 9/2009 | Lin | H01L 21/823412 257/500 |
| 2021/0064719 | A1* | 3/2021 | Wolpert | G06F 30/392 |

* cited by examiner

*Primary Examiner* — Bradley Smith
(74) *Attorney, Agent, or Firm* — Winston Hsu (57) ABSTRACT

A method of fabricating a semiconductor device, including a high-voltage device region and a low-voltage device region, includes the steps of: providing a substrate, wherein a bottom mask layer and a top mask layer are sequentially disposed thereon; forming a doped region in the substrate based on a first layout pattern; patterning the substrate based on a second layout pattern to form at least two trenches in the substrate respectively in the high-voltage device region and the low-voltage device region; and patterning the top mask layer in the high-voltage device region based on a third layout pattern to form a patterned top mask layer and expose the bottom mask layer from the patterned top mask layer, wherein the third layout pattern is generated by comparing the first layout pattern and the second layout pattern and executing a Boolean operation.

13 Claims, 8 Drawing Sheets

METHOD OF FABRICATING SEMICONDUCTOR DEVICE

BACKGROUND OF THE INVENTION

1. Field of the Invention

The present disclosure relates to a method of fabricating a semiconductor device, and more particularly, to a method of fabricating a semiconductor device with trenches formed in a substrate with different trench depths.

2. Description of the Prior Art

For semiconductor devices that integrate high-voltage components (such as radio frequency devices) and low-voltage components (such as logic devices or memory devices), because the operating voltages for the two components are different, different isolation structures (such as shallow trench isolation structure) are required so as to provide sufficient electrical isolation property. For example, for a specific region of a semiconductor device where a high-voltage component is disposed, the depth of the isolation structure in the region is usually deeper than the depth of other isolation structures in other regions; and for another specific region of the semiconductor device where a low-voltage component is disposed, the depth of the isolation structure is usually shallower than the depth of other isolation structures in other regions.

However, for current semiconductor fabricating processes, since the isolation structures in the high-voltage component region and the low-voltage component region are usually fabricated in the same etching process, the isolation structures in both regions usually have the same depth. Thus, the requirement for different trench depths in different regions may not be met.

Therefore, there is a need for an improved method which may solve the drawbacks in conventional fabricating processes.

SUMMARY OF THE INVENTION

In view of this, the present disclosure provides a method of fabricating a semiconductor device to solve the drawbacks in conventional fabricating processes.

According to an embodiment of the present disclosure, a method of fabricating a semiconductor device is provided. A method of fabricating a semiconductor device, including a high-voltage device region and a low-voltage device region, includes the steps of: providing a substrate, wherein a bottom mask layer and a top mask layer are sequentially disposed thereon; forming a doped region in the substrate based on a first layout pattern; patterning the substrate based on a second layout pattern to form at least two trenches in the substrate respectively in the high-voltage device region and the low-voltage device region; and patterning the top mask layer in the high-voltage device region based on a third layout pattern to form a patterned top mask layer and expose the bottom mask layer from the patterned top mask layer, wherein the third layout pattern is generated by comparing the first layout pattern and the second layout pattern and executing a Boolean operation.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The present disclosure may be understood by reference to the following detailed description, taken in conjunction with the drawings as described below. It is noted that, for purposes of illustrative clarity and being easily understood by the readers, various drawings of this disclosure show a portion of the device, and certain elements in various drawings may not be drawn to scale. In addition, the number and dimension of each device shown in drawings are only illustrative and are not intended to limit the scope of the present disclosure.

Certain terms are used throughout the following description to refer to particular components. One of ordinary skill in the art would understand that electronic equipment manufacturers may use different technical terms to describe the same component. The present disclosure does not intend to distinguish between the components that differ only in name but not function. In the following description and claims, the terms "include", "comprise", and "have" are used in an open-ended fashion and thus should be interpreted as the meaning of "include, but not limited to".

It is understood that, although the terms first, second, third, etc. may be used herein to describe various elements, components, regions, layers and/or sections, these elements, components, regions, layers and/or sections should not be limited by these terms. These terms may be only used to distinguish one element, component, region, layer and/or section from another region, layer and/or section. Terms such as "first," "second," and other numerical terms when used herein do not imply a sequence or order unless clearly indicated by the context. Thus, a first element, component, region, layer and/or section discussed below could be termed a second element, component, region, layer and/or section without departing from the teachings of the embodiments.

When an element or layer is referred to as being "coupled to" or "connected to" another element or layer, it may be directly coupled or connected to the other element or layer, or intervening elements or layers may be presented. In contrast, when an element is referred to as being "directly coupled to" or "directly connected to" another element or layer, there are no intervening elements or layers presented.

It should be noted that the technical features in different embodiments described in the following may be replaced, recombined, or mixed with one another to constitute another embodiment without departing from the spirit of the present disclosure.

Figure 1:
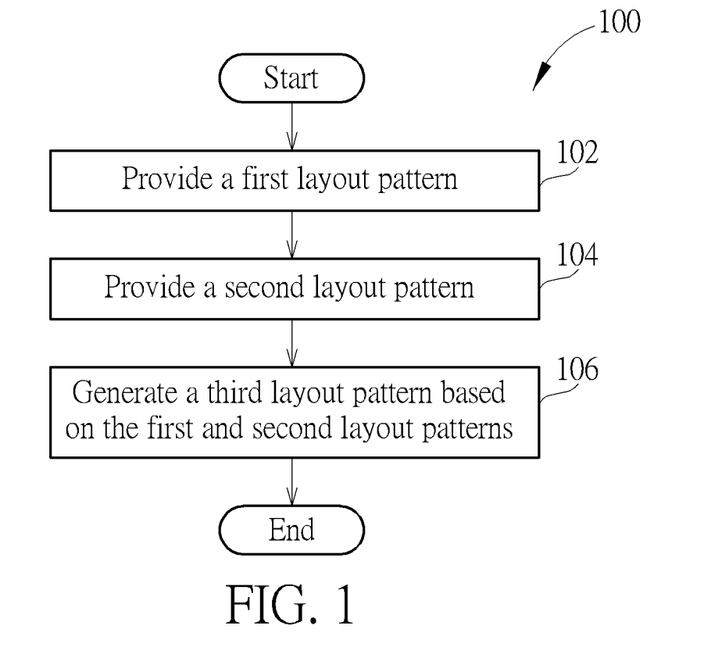
FIG. 1 is a flowchart of a method for generating a layout pattern according to an embodiment of the disclosure.

FIG. 1 is a flowchart of a method for generating a layout pattern according to an embodiment of the disclosure. Referring to FIG. 1, step 102 in method 100 is executed to provide a first layout pattern. The first layout pattern may be a circuit layout pattern, such as the layout pattern of doped regions in a semiconductor device or the layout pattern of doped regions in high-voltage device region. Next, step 104 is executed to provide a second layout pattern. The second layout pattern may also be a circuit layout pattern, and the pattern therein is different from the pattern in the first layout pattern. The second layout pattern may be a layout pattern used to form an isolation structure (such as a shallow trench isolation structure) in a semiconductor device, or a layout pattern used to form an isolation structure in both high-voltage device region and low-voltage device region. Next, step 106 is performed to generate a third layout pattern based on the first layout pattern and the second layout pattern. The third layout pattern may also be a circuit layout pattern, and a part of the third layout pattern may correspond to a part of the second layout pattern. For example, the pattern in the third layout pattern may be generated through a Boolean operation, and the pattern in the third layout pattern may be used to define an isolation structure in a semiconductor device. For example, the pattern in the third layout pattern may be used to define a shallow trench isolation structure in a high-voltage device region in the semiconductor device.

It should be noted that, for method 100, the first layout pattern, the second layout pattern, and the third layout pattern are stored in a computer readable medium. In subsequent processes, layout patterns may be output from a computer-readable medium, and corresponding mask patterns may be further fabricated in at least three independent reticles (or photomasks) based on individual layout patterns.

In the above manner, the existing first layout pattern and the existing second layout pattern may be used to automatically generate the third layout pattern. In addition, by using the automatically generated third layout pattern, the layout pattern of the shallow trench isolation structure in the high-voltage device region of the semiconductor device may be jointly defined by the second layout pattern and the third layout pattern. In contrast, the shallow trench isolation structure in the low-voltage device region may only be defined by the second layout pattern. By using different layout patterns, in a subsequent semiconductor fabricating process, a shallow trench isolation structure of a high voltage device region and the shallow trench isolation structure in the low-voltage device region may have different depths, which thereby generate different voltage sustaining ability and increase the breakdown voltage and reliability of the semiconductor device.

Figure 2:
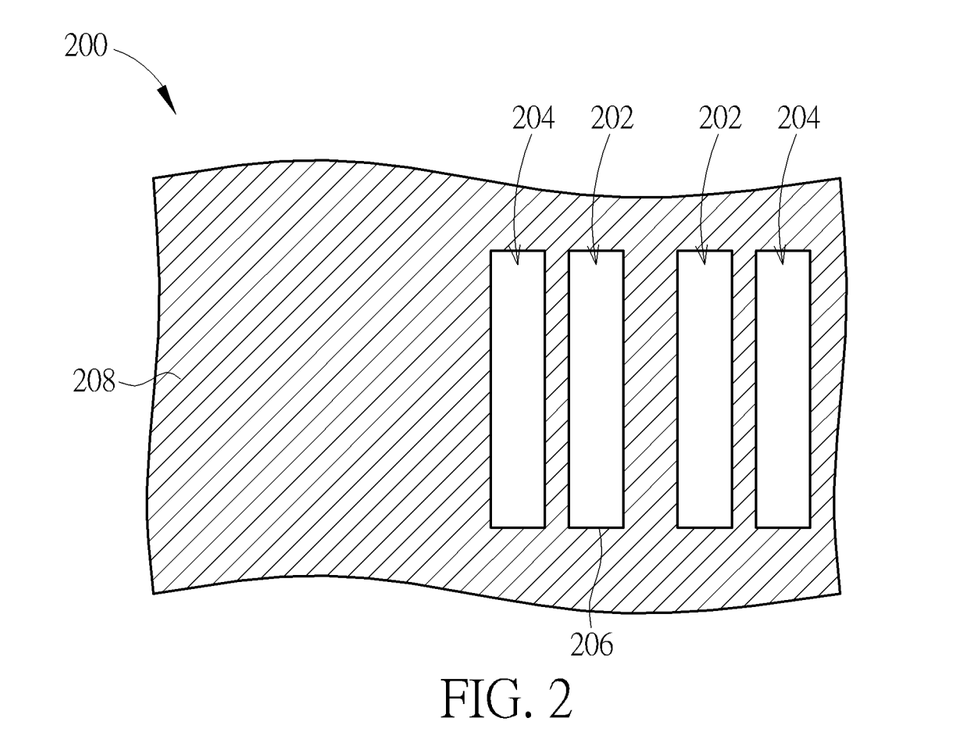
FIG. 2 is a layout pattern for forming a doped region according to an embodiment of the disclosure.

FIG. 2 is a layout pattern for forming a doped region according to an embodiment of the disclosure. Referring to FIG. 2, the first layout pattern 200 may correspond to the first layout pattern described in step 102. The first layout pattern 200 may include a plurality of doped region patterns 202 and 204 and a non-doped region pattern 208 surrounding the doped region patterns 202 and 204. There may be a boundary 206 between the doped region patterns 202 and 204 and the undoped region pattern 208. In the subsequent processes, the doped region patterns 202 and 204 may be used to define doped regions of different conductivity types in the high-voltage component region. For example, the doped region pattern 202 is used to define N-type doped regions, and the doped region pattern 204 is used to define P-type doped regions.

Figure 3:
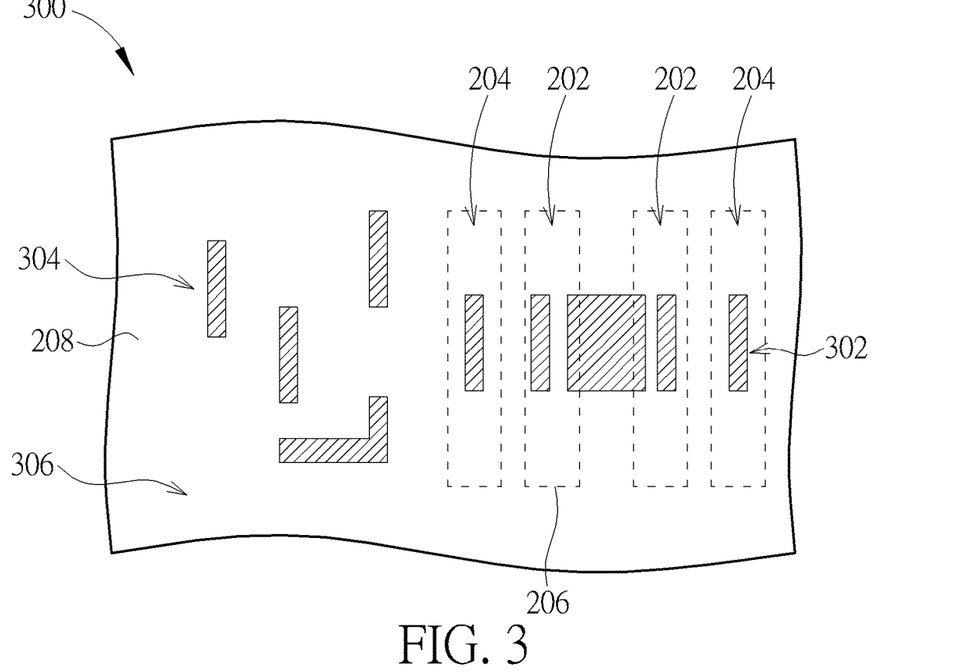
FIG. 3 is a layout pattern for forming a shallow trench isolation structure according to an embodiment of the disclosure.

FIG. 3 is a layout pattern for forming a shallow trench isolation structure according to an embodiment of the disclosure. Referring to FIG. 3, the second layout pattern 300 may correspond to the second layout pattern mentioned in step 104. The second layout pattern 300 may include a shallow trench isolation pattern 306 and an active region pattern, and the active region pattern includes a plurality of polygonal feature patterns 302 and 304. Next, the first layout pattern 200 and the second layout pattern 300 are compared to determine whether the feature patterns 302 and 304 overlap the doped region patterns 202 and 204. For example, portions or all of the feature pattern 302 may overlap the doped region pattern 202 and 204; and portions or all of the feature pattern 304 may not overlap the doped regions 202 and 204 but may only overlap non-doped region pattern 208.

Figure 4:
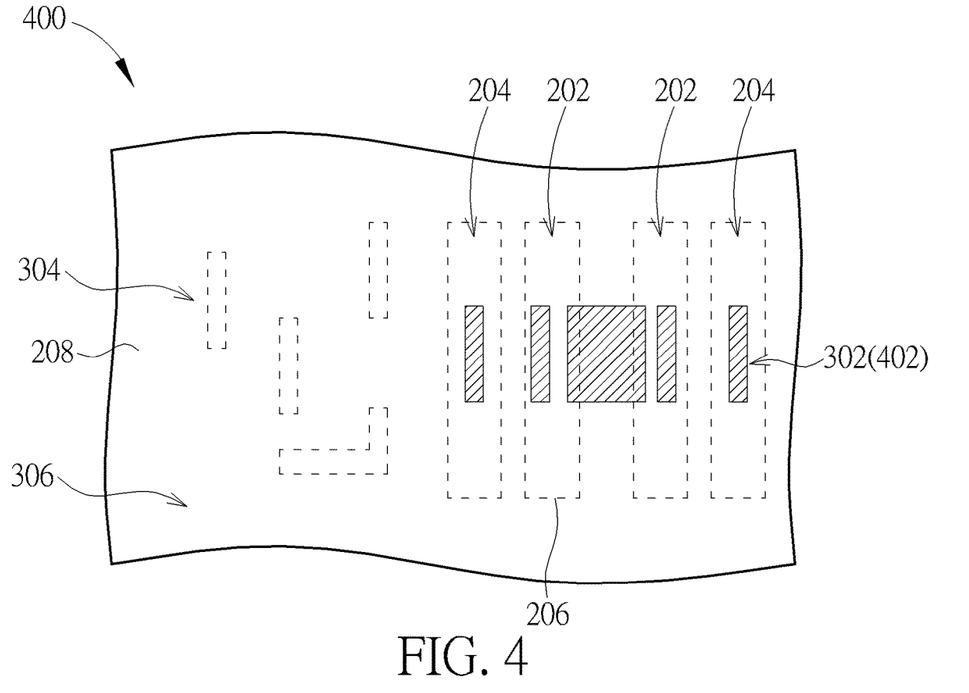
FIG. 4 is a layout pattern of a shallow trench isolation structure for forming a high-voltage device region according to an embodiment of the disclosure.

FIG. 4 is a layout pattern for forming a shallow trench isolation structure in a high-voltage device region according to an embodiment of the disclosure. Referring to FIG. 4, the first three layout pattern 400 may correspond to the third layout pattern in step 106. The third layout pattern 400 may be generated by using a Boolean operation to remove the feature patterns 302 and 304 that do not overlap the doped region patterns 202 and 204 in the second layout pattern 300 so as to generate the third layout pattern 400. Therefore, the third layout pattern 400 may have a plurality of feature patterns 402 separately disposed from each other, and the positions and contours of the feature patterns 402 may correspond to the positions and contours of the feature patterns 302 overlapping the doped region patterns 202 and 204 in the second layout pattern 300.

Figure 5:
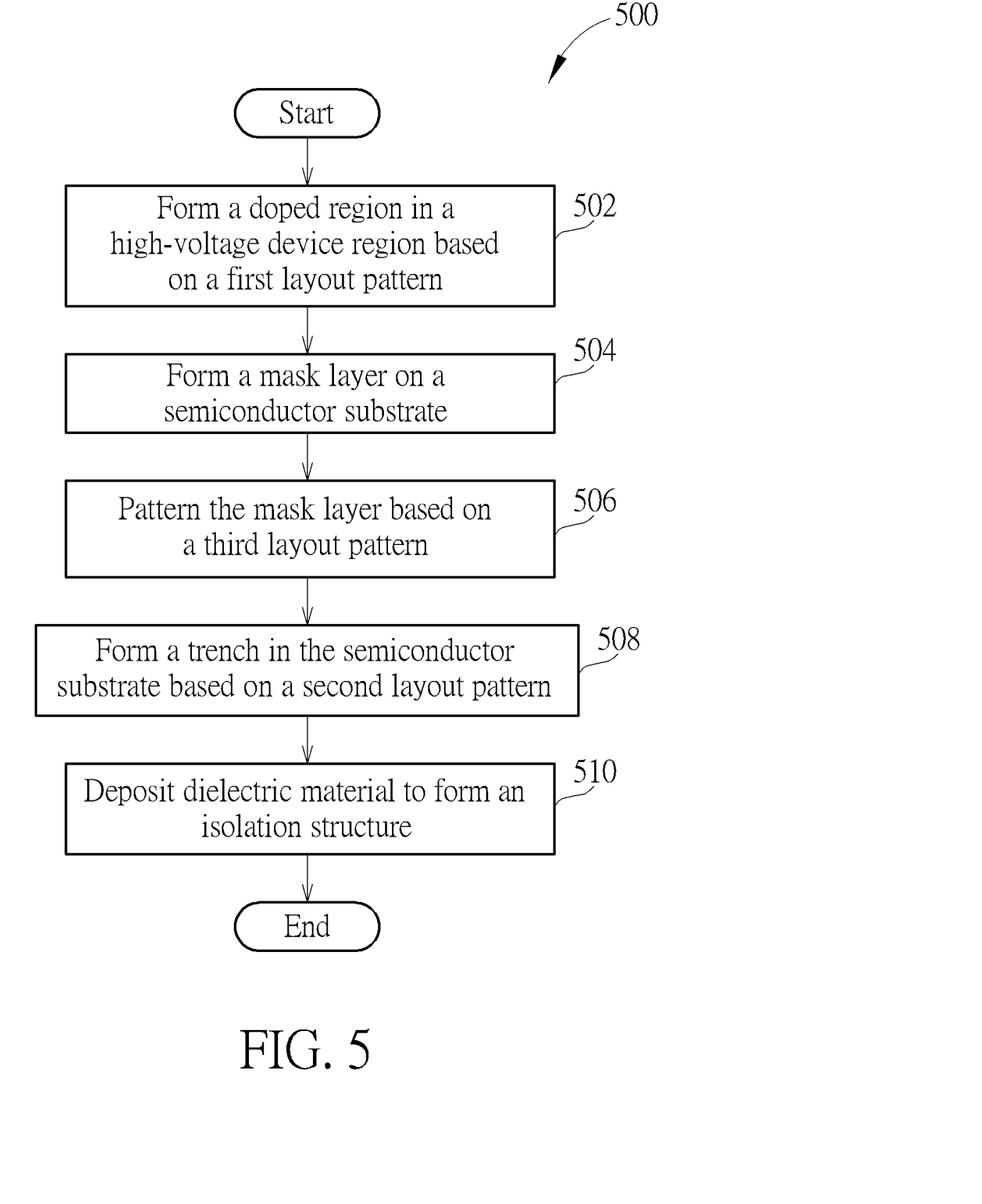
FIG. 5 is a flowchart of a method for fabricating a semiconductor device according to an embodiment of the disclosure.
Figure 6:
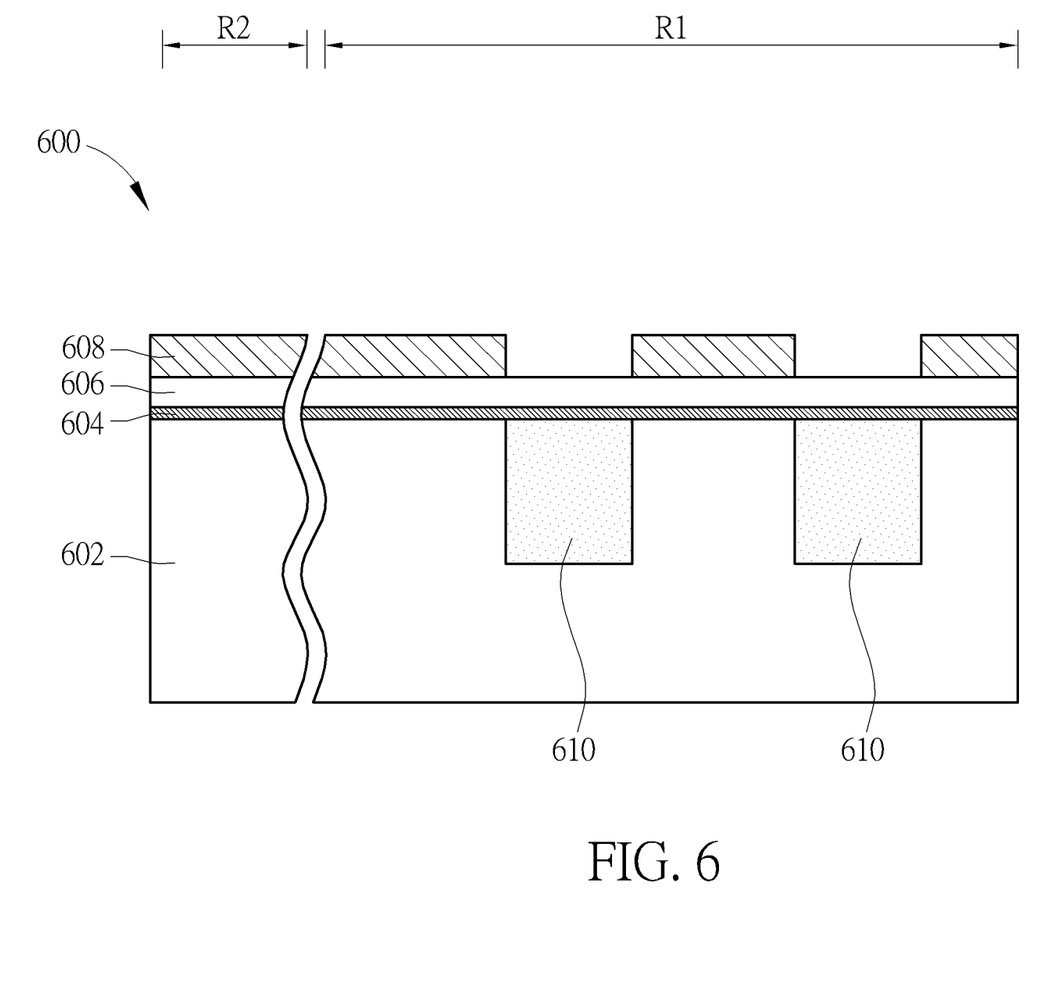
FIG. 6 is a schematic cross-sectional view of a semiconductor device having a doped region according to an embodiment of the disclosure.

FIG. 5 is a flowchart of a method for fabricating a semiconductor device according to an embodiment of the disclosure. FIG. 6 is a schematic cross-sectional view of a semiconductor device having a doped region. Referring to FIG. 6, in step 502 of the method 500, a doped region 610 in the high-voltage device region R1 is formed based on the first layout pattern 200. In this process stage, the semiconductor device 600 includes a high-voltage device region R1 and a low-voltage device region R2, and includes a substrate 602, a bottom mask layer 604, and a top mask layer 606. The substrate 602 may be a semiconductor substrate, and the bottom mask layer 604 and the top mask layer 606 are etching mask layers of different materials, such as silicon oxide and silicon nitride, respectively. The photoresist pattern 608 may be formed by using a photolithography and development process to transfer the first layout pattern 200 to the photoresist layer on the top mask layer 606. The opening in the photoresist pattern 608 may substantially correspond to the doped region pattern 202 in the first layout pattern 200. After the photoresist pattern 608 is formed, an ion implantation process may be performed to form a doped region, such as an N-type doped region, in the substrate 602.

Figure 7:
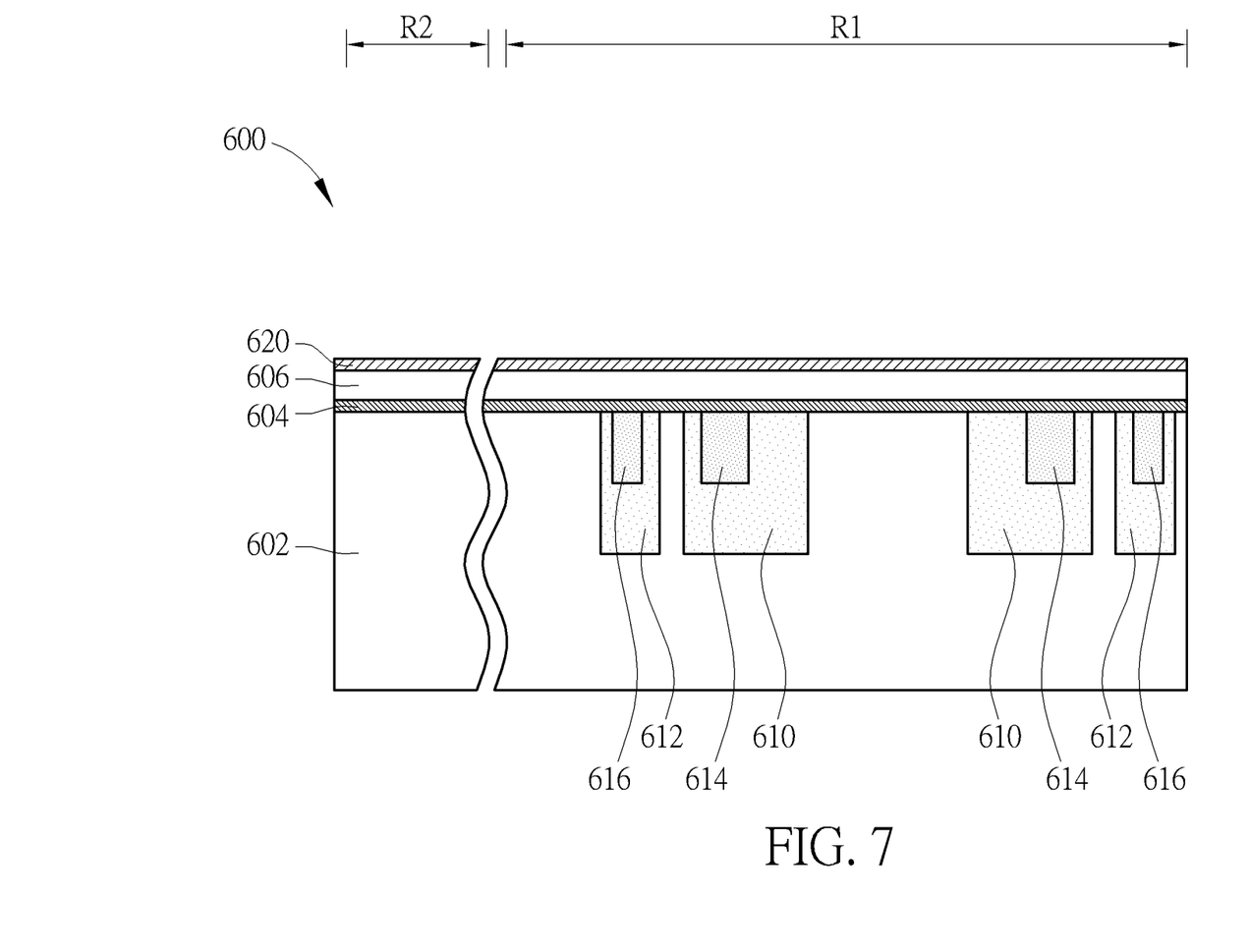
FIG. 7 is a schematic cross-sectional view of a semiconductor device having a doped region and a heavily doped region.

FIG. 7 is a schematic cross-sectional view of a semiconductor device having a doped region and a heavily doped region. Additional processes, such as photolithography, etching, and ion implantation may be performed to form a doped region 612 in the substrate 602, such as a P-type doped region, and form heavily doped regions 614 and 616, such as N-type heavily doped regions 614 and P-type heavily doped regions 616. The heavily doped region 614 and the doped region 610 have the same conductivity type, while the heavily doped region 616 and the doped region 612 have the same conductivity type. The doped regions 610 and 612 and the heavily doped regions 614 and 616 are all located in the high-voltage device region R1.

Next, step 504 is performed to form a mask layer 620, such as a silicon oxide layer, on the substrate 602. The mask layer 620 is comprehensively formed in the high-voltage device region R1 and in the low-voltage device region R2.

Figure 8:
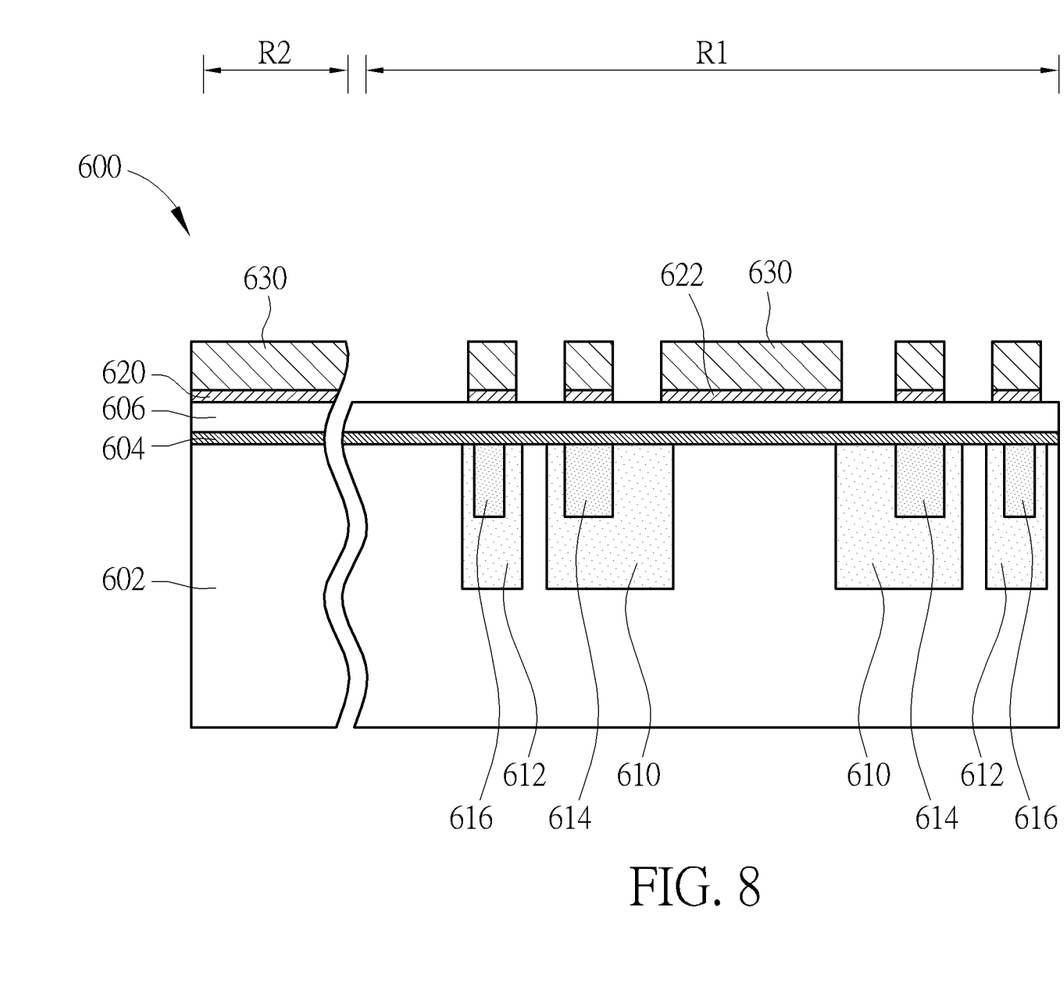
FIG. 8 is a schematic cross-sectional view of a semiconductor device having a patterned masking layer according to an embodiment of the disclosure.

FIG. 8 is a schematic cross-sectional view of a semiconductor device having a patterned masking layer according to an embodiment of the disclosure. Referring to FIG. 8, step 506 is performed to form a patterned mask layer 622 on the top masking layer 606 based on the third layout pattern 400. Specifically, after the fabrication of the structure shown in FIG. 7, a photolithography process may be performed to transfer the third layout pattern 400 to the photoresist layer on the mask layer 620 to thereby form a photoresist pattern 630. The photoresist in the photoresist pattern 630 may substantially correspond to the feature pattern 402 in the third layout pattern 400. After the photoresist pattern 630 is formed, an etching process may be performed to etch the mask layer 620 to obtain a patterned mask layer 622.

Figure 9:
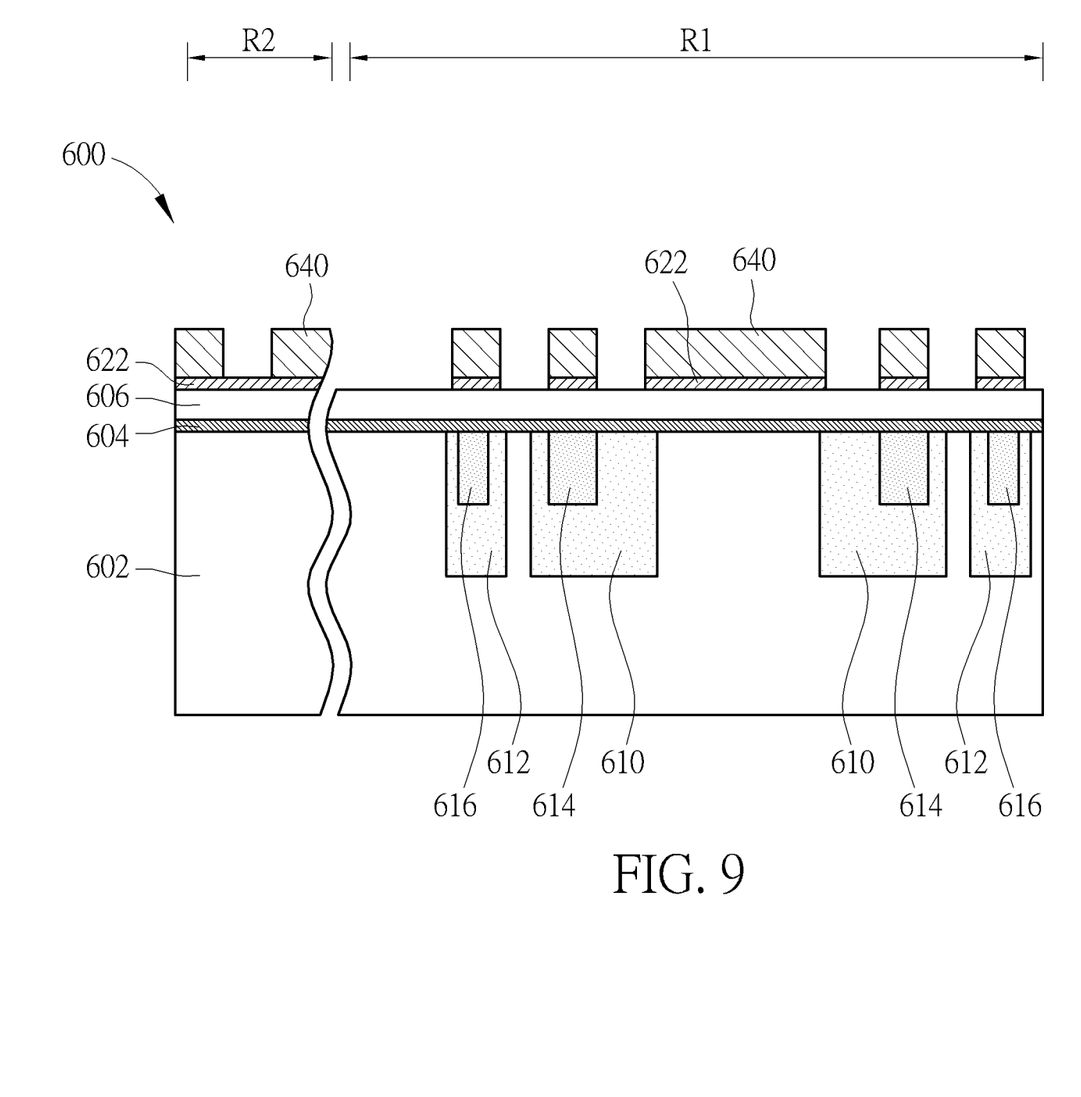
FIG. 9 is a schematic cross-sectional view of a semiconductor device having a patterned mask layer according to an embodiment of the disclosure.

Step 508 is then performed to form a trench in the substrate 602 based on the second layout pattern 300. Specifically, referring to FIG. 9, FIG. 9 is a schematic cross-sectional view of a patterned mask layer in a semiconductor device according to an embodiment of the disclosure. A photolithography process may be used to transfer the second layout pattern 300 to the photoresist layer on the mask layer 622. The photoresist portion in the photoresist pattern 640 may correspond to the feature patterns 302 and 304 in the second layout pattern 300. Next, an etch process may be performed to etch the patterned mask layer 622, especially the patterned mask layer 622 in the low-voltage device region R2.

The etching process may then be performed, and the appropriate etching gas and etching parameters may be adjusted to transfer the pattern defined in the photoresist pattern 640 to the top mask layer 606 or the bottom mask layer 604 to form a patterned top mask layer 606 or a patterned bottom mask layer 604.

Figure 10:
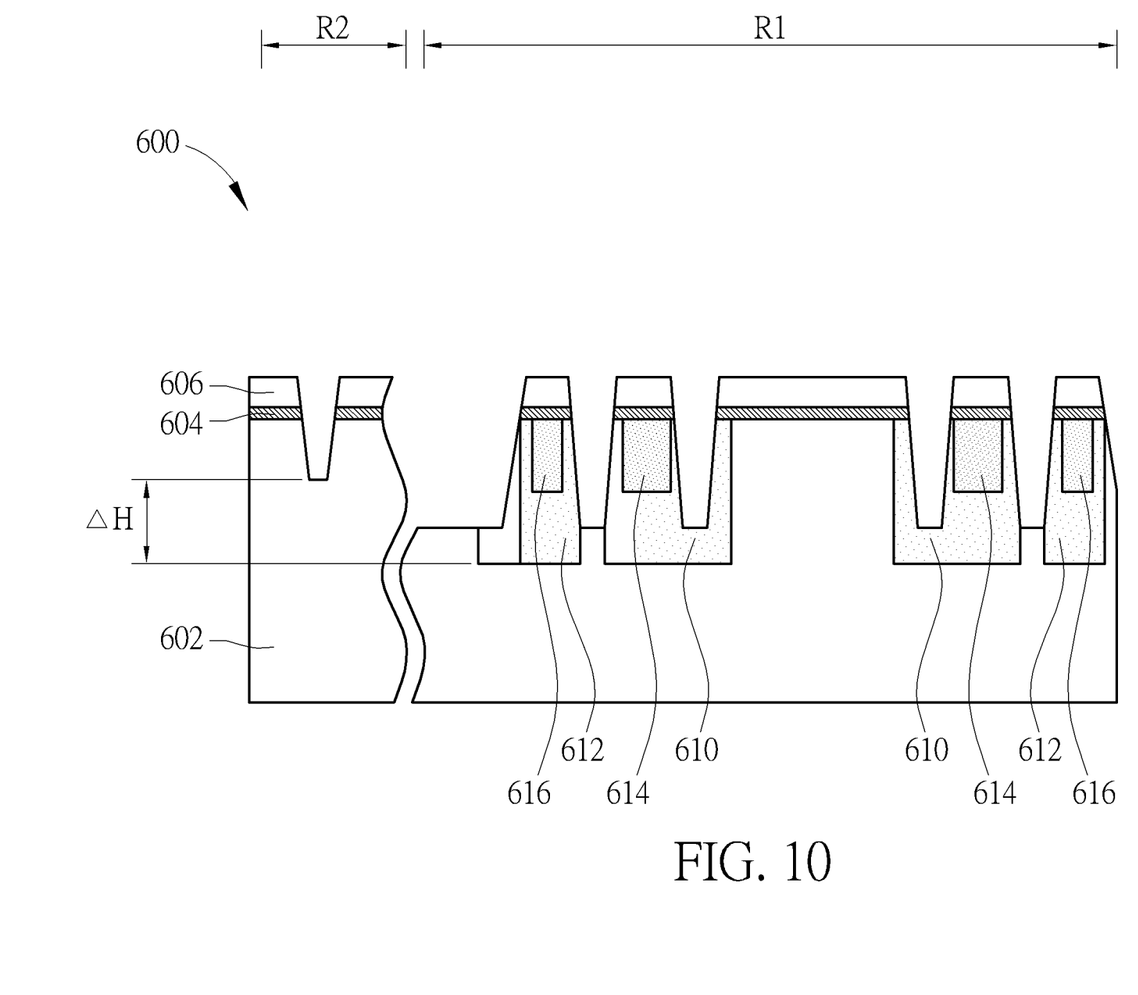
FIG. 10 is a schematic cross-sectional view of a trench in a semiconductor device according to an embodiment of the disclosure.

FIG. 10 is a schematic cross-sectional view of a semiconductor device with trenches according to an embodiment of the present disclosure. Referring to FIG. 10, another etching process is conducted, and an appropriate etching gas and etching parameters are adjusted and the patterned top mask layer 606 or the patterned bottom mask layer 604 are used as a etch mask to form trenches in the substrate 602. Since the trenches in the low-voltage device region R2 are further covered by the patterned mask layer 622 during the formation of the trenches, the depth of the trenches in the low-voltage device region R2 is shallower than the depth of the trenches in the high-voltage device region R1. That is to say, there is a height difference ΔH between two trenches.

Finally, step 510 is performed to deposit a dielectric material to fill the trenches in the high-voltage device region R1 and the low-voltage device region R2 to thereby form an isolation structure.

According to the disclosed embodiments, the trenches in the low-voltage device region R2 may be further covered by the patterned mask layer 622 by using different photomask layout patterns, so the depths of the trenches in the low-voltage device region R2 are shallower than those in the high-voltage device region R1. Also, there is a height difference ΔH between the trenches. Therefore, the shallow trench isolation structure formed in the low-voltage device region R2 may be shallower than the shallow trench isolation structure formed in the high-voltage device region R1. Therefore, the shallow trench isolation structure in the high-voltage device region R1 and the shallow trench isolation structure in the low-voltage device region R2 may have different depths and different voltage sustaining ability, thereby increasing the breakdown voltage and the reliability of the semiconductor device 600.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a semiconductor device, wherein the semiconductor device comprises a high-voltage device region and a low-voltage device region, and the method comprises:
   providing a substrate, wherein a bottom mask layer and a top mask layer are sequentially disposed thereon;
   forming a doped region in the substrate based on a first layout pattern;
   patterning the substrate based on a second layout pattern to form at least two trenches in the substrate respectively in the high-voltage device region and the low-voltage device region; and
   patterning the top mask layer in the high-voltage device region based on a third layout pattern to form a patterned top mask layer and expose the bottom mask layer from the patterned top mask layer, wherein the third layout pattern is generated by comparing the first layout pattern and the second layout pattern and executing a Boolean operation.

2. The method of fabricating a semiconductor device according to claim 1, wherein the composition of the bottom mask layer and the composition of the top mask layer are different from each other.

3. The method of fabricating a semiconductor device according to claim 1, wherein the top mask layer in the low-voltage device region covers the bottom mask layer when the step of patterning the top mask layer in the high-voltage device region is completed.

4. The method of fabricating a semiconductor device according to claim 1, before the step of forming the at least two trenches, further comprising:
   forming a patterned photoresist layer on the substrate based on the third layout pattern, wherein the patterned top mask layer in the high-voltage device region is completely covered by the patterned photoresist layer, and the patterned top mask layer in the low-voltage device region is partially exposed from the patterned photoresist layer.

5. The method of fabricating a semiconductor device according to claim 1, wherein the patterned top mask layer comprises at least one opening.

6. The method of fabricating a semiconductor device according to claim 5, wherein the at least one opening is in the high-voltage device region.

7. A method of fabricating a semiconductor device according to claim 1, further comprising using a first photomask, a second photomask, and a third photomask, wherein,
the first photomask comprises a first layout pattern, and the first layout pattern comprises a doped region pattern;
the second photomask comprises the second layout pattern, and the second layout pattern comprises a shallow trench isolation pattern and an active region pattern, wherein the active region pattern comprises a plurality of feature patterns; and
the third photomask comprises the third layout pattern.

8. The method of fabricating a semiconductor device according to claim 7, wherein the step of generating the third layout pattern comprises:
comparing the first layout pattern and the second layout pattern to generate the feature patterns overlapping the doped region pattern and the feature patterns not overlapping the doped region pattern; and
removing the feature patterns not overlapping the doped region pattern from the second layout pattern to thereby generate the third layout pattern.

9. The method of fabricating a semiconductor device according to claim 8, wherein each of the feature patterns in the active region pattern is surrounded by the shallow trench isolation pattern.

10. The method of fabricating a semiconductor device according to claim 8, wherein the feature patterns overlapping the doped region pattern comprise the feature patterns completely overlapping the doped region pattern and the feature patterns partially overlapping the doped region pattern.

11. The method of fabricating a semiconductor device according to claim 8, wherein the third layout pattern comprises a plurality of feature patterns, wherein each of the feature patterns of the third layout pattern are separated from each other.

12. The method of fabricating a semiconductor device according to claim 8, wherein positions of the feature patterns of the third layout pattern correspond to positions of the feature patterns overlapping the doped region pattern of the second layout pattern.

13. The method of fabricating a semiconductor device according to claim 7, wherein the third photomask comprises a plurality of feature patterns, and contours and positions of the feature patterns of the third photomask correspond to contours and positions of the feature patterns overlapping the doped region pattern of the second layout pattern.

\* \* \* \* \*